United States Patent
Tews et al.

(10) Patent No.: US 6,436,846 B1
(45) Date of Patent: Aug. 20, 2002

(54) COMBINED PREANNEAL/OXIDATION STEP USING RAPID THERMAL PROCESSING

(75) Inventors: Helmut Horst Tews, Poughkeepsie, NY (US); Martin Schrems, Langenbrueck; Thomas Gaertner, Ottendorf-Okrilla, both of (DE)

(73) Assignee: Siemens Aktiengesellscharft, Munich (DE)

( * ) Notice: Subject to any disclaimer, the term of this patent is extended or adjusted under 35 U.S.C. 154(b) by 0 days.

(21) Appl. No.: 09/146,870

(22) Filed: Sep. 3, 1998

(51) Int. Cl.$^7$ .............................................. H01L 21/469
(52) U.S. Cl. ..................... 438/770; 438/471; 438/477; 438/787
(58) Field of Search ................................ 438/758, 765, 438/768, 769, 770, 471, 477, 787, 928, 974; H01L 21/26, 21/322

(56) References Cited

U.S. PATENT DOCUMENTS

| 4,314,595 A | * | 2/1982 | Yamamoto et al. ......... 438/471 |
| 5,242,854 A | * | 9/1993 | Solheim et al. ............. 438/363 |
| 5,360,769 A | * | 11/1994 | Thakur et al. .............. 438/762 |
| 6,100,149 A | * | 8/2000 | Nenyei et al. .............. 438/308 |
| 6,191,010 B1 | * | 2/2001 | Falster ........................ 438/471 |

OTHER PUBLICATIONS

Yao, et al., "High Quality Ultrathin Dielectric Film Grown on Silicon in a Nitric Oxide Ambient", Applied Physics Letters, vol. 64, No. 26, pp. 3584–3586, Jun. 27, 1994.*
Wolf, S. and Tauber, R.N., Silicon Processing for the VLSI Era—vol. 1, pp. 216–217, 1986.*

* cited by examiner

Primary Examiner—Michael Trinh
Assistant Examiner—Christy Novacek
(74) Attorney, Agent, or Firm—Stahton Braden

(57) ABSTRACT

A combined preanneal/oxidation step using a rapid thermal process (RTP) for treatment of a silicon wafer to form a thermal oxide of a given thickness while simultaneously adjusting the denuded zone depth and bulk micro defect density (BMD) comprising:

exposing the wafer to a controlled temperature and a controlled preannealing time in an oxidation ambient at ambient pressure to obtain a target thermal oxide thickness that is preselected to correspond to a preselected denuded zone depth.

6 Claims, 6 Drawing Sheets

COMBINED PREANNEAL/OXIDATION STEP USING RAPID THERMAL PROCESSING

BACKGROUND OF THE INVENTION

1. Field of the Invention

The invention is directed to a combined preanneal/oxidation step using rapid thermal processing (RTP) in DRAM technologies for preannealing silicon wafers. In particular, in an improved process for preannealing silicon wafers, the invention method simultaneously forms a denuded zone (DZ) and a pad oxide of a given thickness by a single RTP process.

2. Description of the Prior Art

In the process of preparing silicon wafers, oxygen is present in Si ingots after Czochralski growth. The origin of the oxygen is the quartz crucible which contains the Si melt during growth and which partly dissolves in it.

When the wafers are cut from the ingot, this oxygen is still contained in the wafers, mostly in interstitial form. Therefore, the first step in DRAM technologies is to anneal the wafers in a complicated high temperature process. In this complicated high temperature process, the objective or target is to outdiffuse the oxygen from a 10–20 $\mu$m thick layer of the wafer surface and at the same time to form $SiO_2$ precipitates in the wafer bulk. This preanneal step creates the "denuded zone" (DZ) or region devoid of oxygen-related defects near the surface of wafer required for processing, and it provides wafers with a high internal gettering capability. During preanneal, a thin oxide layer is usually grown. However, the disadvantage of this formed oxide is that it has an uncontrolled thickness and it must be stripped prior to the formation of the pad oxide.

In a method for preparing silicon wafers, an intrinsic-gettering process is disclosed in U.S. Pat. No. 5,674,756. The process comprises heating a silicon wafer containing oxygen precipitate nuclei from room temperature up to 800° to about 1000° C. at a rate of at least 10° C./minute and holding the wafer at this temperature for 0.5 to 20 minutes to obtain a silicon wafer with effective intrinsic gettering. In this process, it is indicated that when the holding time exceeds 20 minutes, a DZ layer with an excessive thickness is obtained and oxygen precipitate nuclei are grown into stable sizes during the holding time.

U.S. Pat. No. 4,597,804 discloses a method of forming a denuded wafer by intrinsic gettering comprising annealing the silicon wafer at an annealing temperature selected from a range of 500° through 1300° C. by heating the silicon wafer such that the annealing temperature corresponds to a first temperature selected from a range of 500° C. through 900° C., and increasing the annealing temperature to a second temperature selected from a range of 950° C. through 1300° C., the annealing temperature being increased from a first temperature to the second temperature at a rate not exceeding 14° C./minute.

A process for producing a semi-conductor silicon wafer is disclosed in U.S. Pat. No. 5,534,294, and comprises: forming an oxide film with a thickness of 1 nm to 3 nm on one side of a silicon wafer; depositing a polycrystal silicon on the oxide film formed; and subjecting the silicon wafer to a heat treatment in an inert gas, a reducing gas or a mixture thereof in a manner where the other side of the silicon wafer is exposed to the gases, so that oxygen is discharged from the other side whereby a denuded zone is formed on the other side. It is indicated that the silicon wafer obtained as a result of this process has a surface denuded zone formed on the top side.

U.S. Pat. No. 5,401,669 discloses a process for preparation of silicon wafers having controlled distribution of the density of the oxygen precipitate nucleation centers. The process is accomplished by exposing an unshielded face of the wafer to an atmosphere which contains nitrogen or a nitrogen compound gas during a rapid thermal treatment at a temperature of at least 1175° C., while shielding the other face of the wafer from the atmosphere during the rapid thermal treatment to generate nucleation centers which serve as sites for the growth of oxygen precipitates during a subsequent heat treatment, the nucleation centers having a peak density proximate the unshielded face of the wafer.

There is a need in the art of preparing silicon wafers for simultaneously forming an oxide of a given target thickness and a denuded zone.

There is a further need in the art of preparing silicon wafers to eliminate the disadvantage that an oxide of uncontrolled thickness formed by the preanneal process must be stripped prior to the formation of the pad oxide.

SUMMARY OF THE INVENTION

One object of the present invention is to provide a process for making silicon wafers by simultaneously forming an oxide of a given target thickness and a denuded zone.

Another object of the present invention is to provide a process for forming silicon wafers by providing an oxide of controlled thickness formed by a preanneal step that does not have to be stripped prior to the formation of the pad oxide.

A still further object of the present invention is to provide a process for preparing silicon wafers by utilizing a high temperature oxidation process that creates a denuded zone; adjust the precipitate density to a given target value; and provide a thin pad oxide layer for further processing.

In general, the invention process of providing silicon wafers is accomplished by adjusting the oxide thickness and the DZ depth to desired target values by controlling temperature and annealing time in 100% $O_2$ at high pressure close to atmospheric pressure.

DETAILED DESCRIPTION OF THE INVENTION

In accordance with the present invention, a technique of rapid thermal processing (RTP) has been discovered for forming a thermal oxide and simultaneously adjusting the denuded zone depth and bulk micro defect density (BMD), when forming silicon wafers.

EXAMPLE 1

Atmospheric Pressure Process

Figure 1:
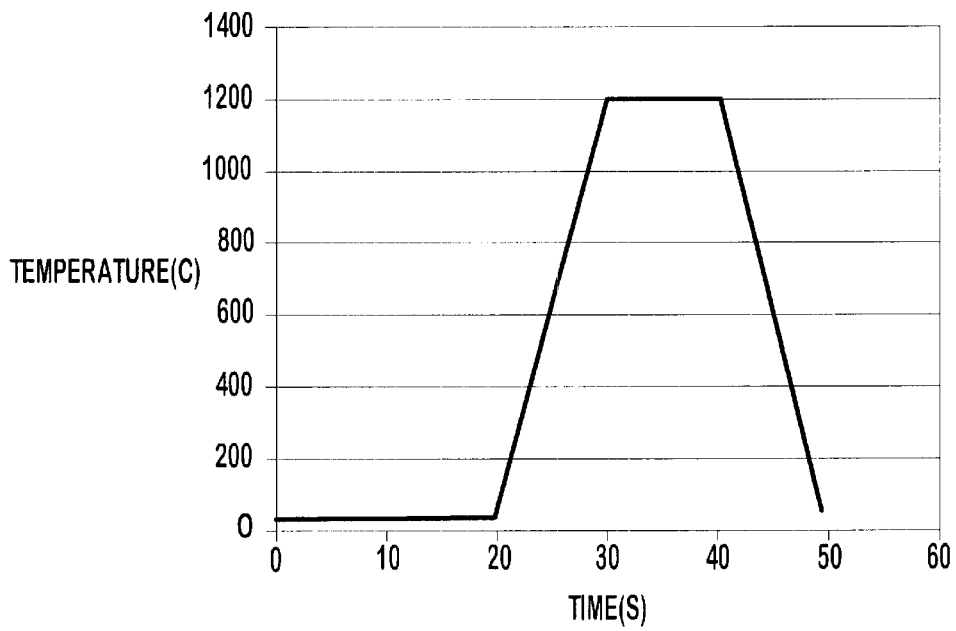
FIG. 1 shows a graph of a RTA temperature profile according to a first embodiment of the invention process.

Referring now to FIG. 1, it may be seen that a single-crystal silicon wafer is taken from ambient temperature to 1200° C. for a holding time of approximately 10 seconds, after which the temperature is taken back down to ambient, to provide a rapid temperature annealing (RTA) temperature profile, in accordance with the first embodiment of the present invention. In this embodiment, the oxide thickness and the DZ depth are adjusted to the desired target values by controlling temperature and annealing time in 100% oxygen and high pressure close to atmospheric pressure, at about 740 T.

Figure 2:
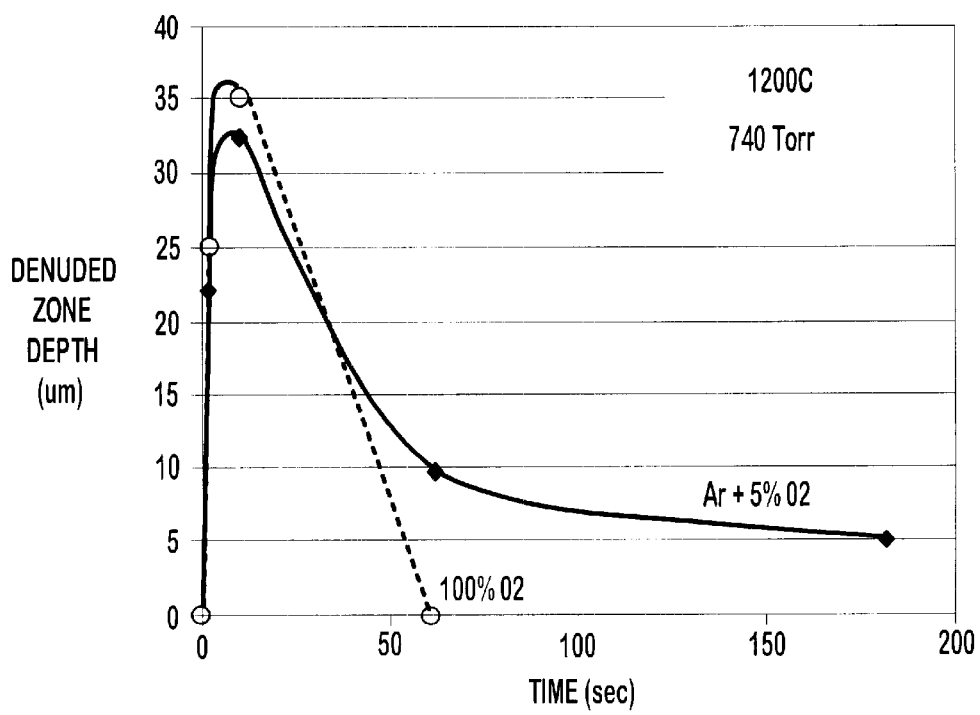
FIG. 2 is a graph of an RTA in diluted oxygen, which shows the DZ depth versus time for RTP at 1200° C. and 740 Torr in 100% oxygen as well as in Argon with 5% oxygen.
Figure 3:
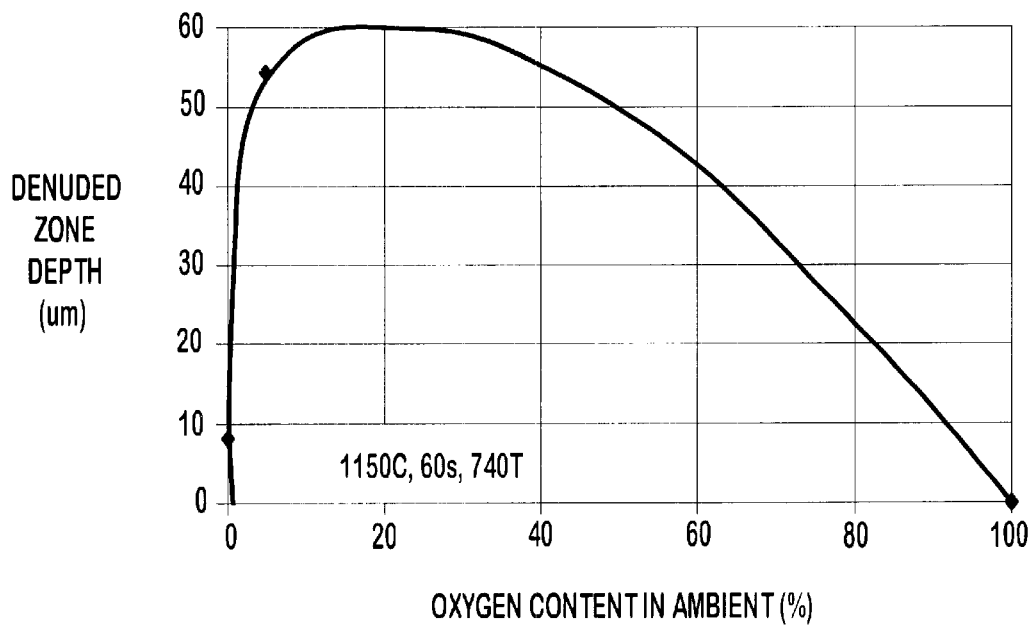
FIG. 3 is a graph depicting dependence of denuded zone of oxygen content in ambient for an 1150° C., 60 s, 740 T RTP step.

In this process, the denuded zone depth is approximately 35 $\mu$m, as may be seen from the DZ depth versus time graph of FIG. 2 for RTP at 1200° C., 740 Torr in 100% oxygen as well as in argon with 5% oxygen. This value is larger than the minimum requested value of 10 $\mu$m.

The dependence of the DZ depth on the oxygen content in the ambient at 1150° C., 60 s, 740 T rapid thermal processing step shows a peak at about 20% of the oxygen content in ambient.

Figure 4:
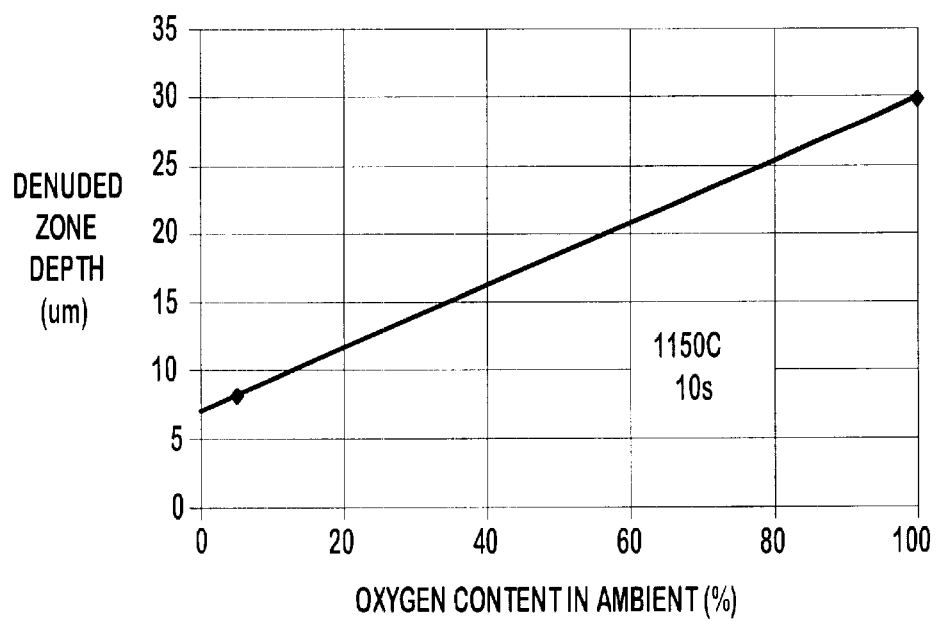
FIG. 4 is a graph showing dependence of denuded zone on oxygen content in ambient for a short 10 s RTP step at 1150° C.

Reference is made to FIG. 4 which depicts a chart of dependence of the denuded zone depth on the oxygen content in the ambient for a short 10 second RT step at 1150° C.

Figure 5:
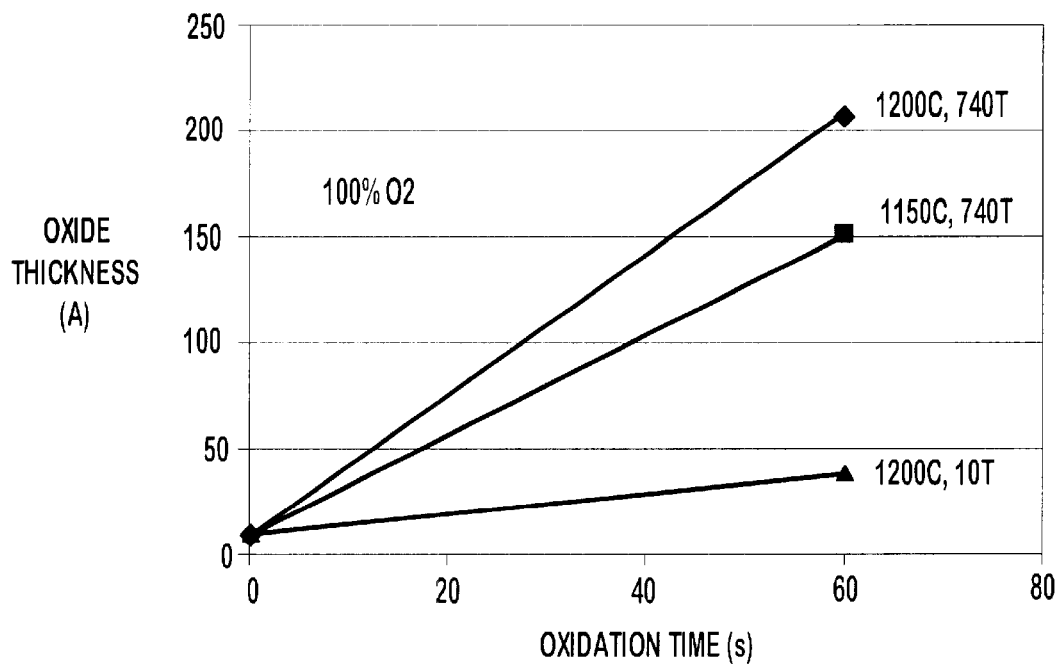
FIG. 5 is a graph of oxide thickness versus time as a function of RTP/oxidation time for three different RTP conditions in pure oxygen.

From FIG. 5, which is a chart of oxide thickness versus time, it can be seen that a target thickness of about 8 nm can be achieved with a 1200° C./10 second RTO process in 100% $O_2$. In fact, in reverting back to FIG. 2, it can be seen that the denuded zone depth is larger than the target value of 10 $\mu$m (actual value 35 $\mu$m).

Figure 6:
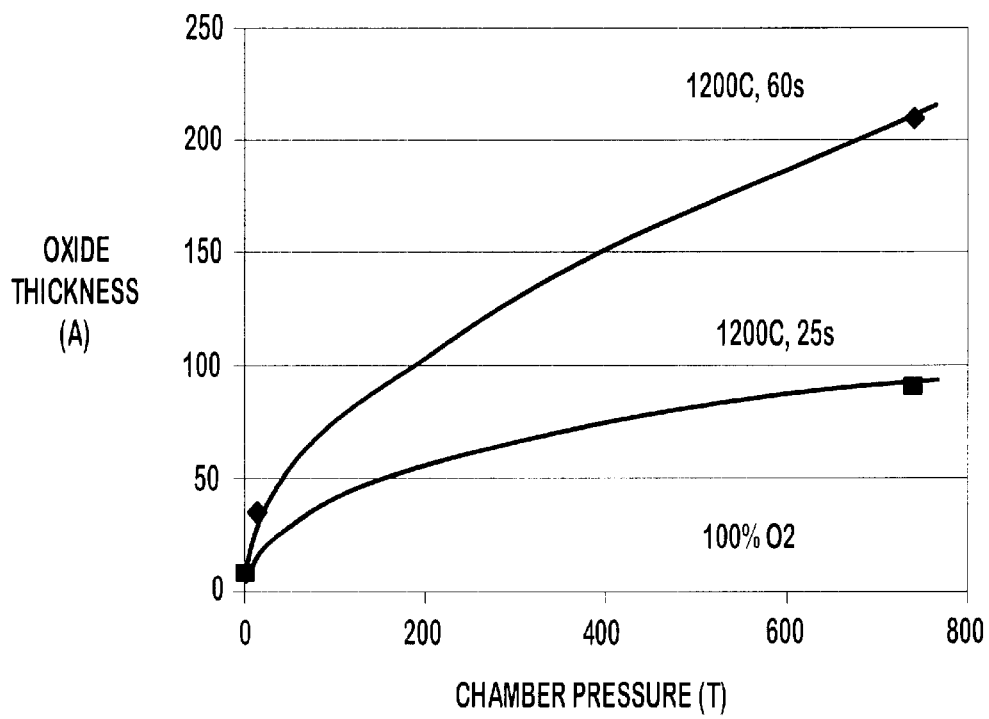
FIG. 6 is a graph of oxide thickness versus chamber pressure and shows the oxide thickness as a function of chamber pressure for two RTO times of 10 s and 60 s.

The graph of FIG. 6 shows oxide thickness versus chamber pressure in 100% $O_2$ for three RTO times of 10 seconds, 25 seconds and 60 seconds.

Figure 7:
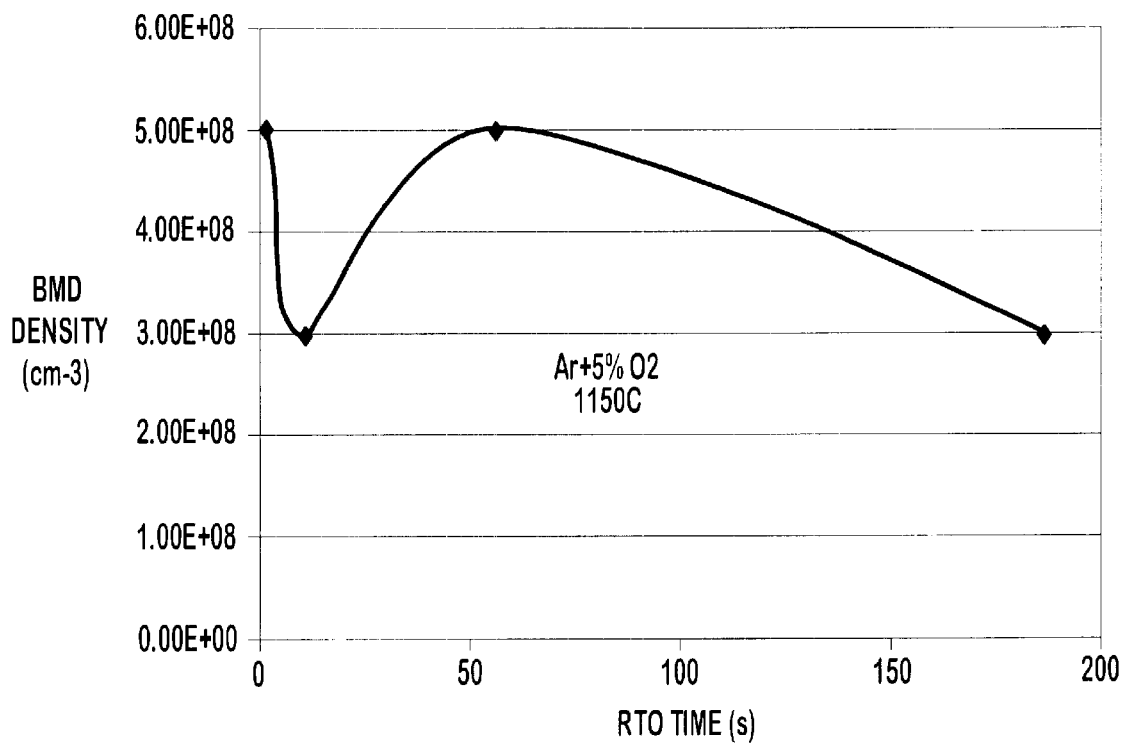
FIG. 7 is a graph of Bulk Micro Defect density (BMD) as a function of RTO time.

FIG. 7 is a chart of the bulk micro defect density (BMD) and depicts the bulk micro defect density as a function of the RTO time.

Figure 8:
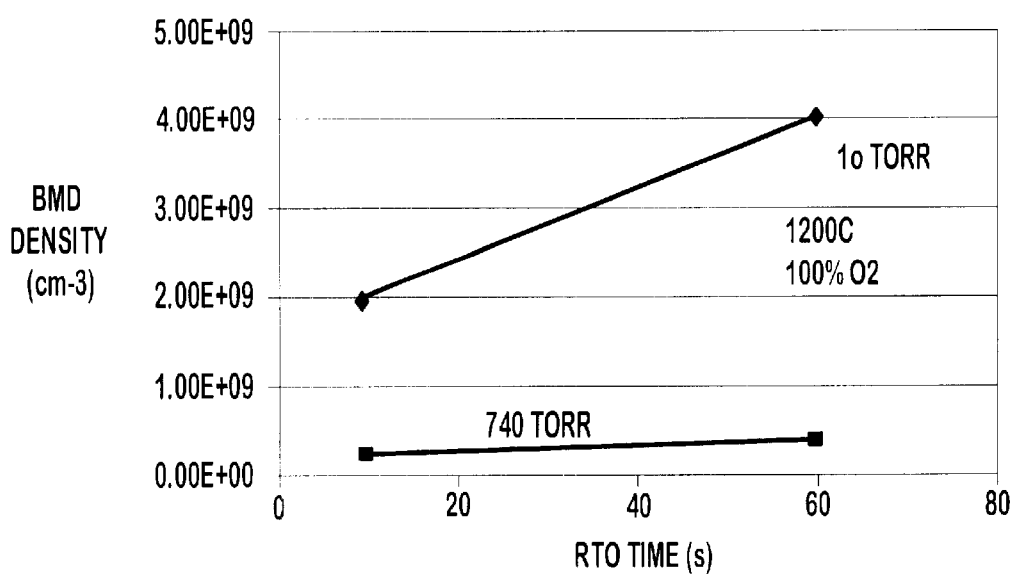
FIG. 8 is a graph of BMD density as a function of RTO time.

The BMD density is a function of total pressure and RTO time, as depicted in FIG. 8, where a sufficiently large precipitate density of approximately 3 e 8 $cm^{-3}$ is achieved during the DRAM device manufacturing cycle.

If it is desired to achieve an oxide target thickness of 4nm, a 1200° C., 2 second RTO in 100% $O_2$ at a pressure of 740 T is useful. According to FIG. 2, this results in a denuded zone depth of approximately 20 $\mu$m which is also sufficient to meet the target value of 10 $\mu$m. Again, the BMD density of this process is approximately 3 e 8 $cm^{-3}$ (See FIG. 8).

Figure 9:
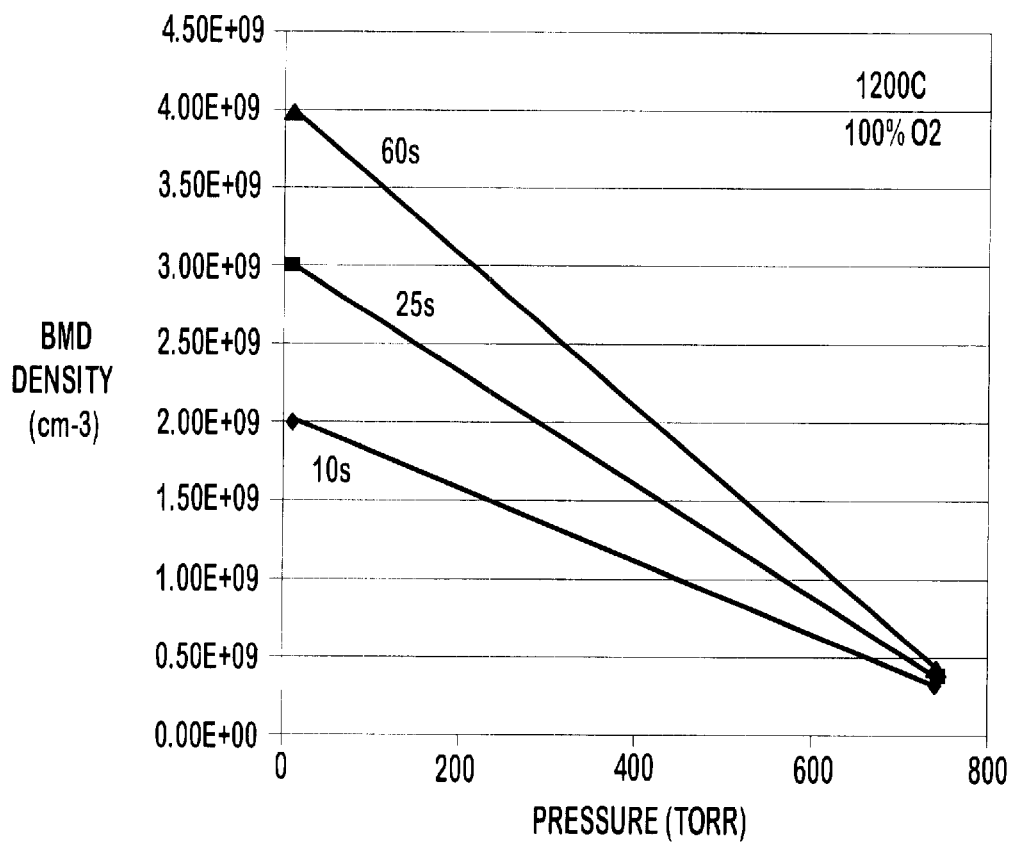
FIG. 9 is a graph of BMD density as a function of total pressure for 10 s, 25 s, and 60 s RTO processes.

In referring to FIG. 9, it is seen that the BMD density as a function of pressure is depicted in 100% $O_2$. The BMD density as a function of total pressure is shown for 10 seconds, 25 seconds and 60 seconds of RTO processes.

EXAMPLE 2

Reduced Pressure Process

Figure 10:
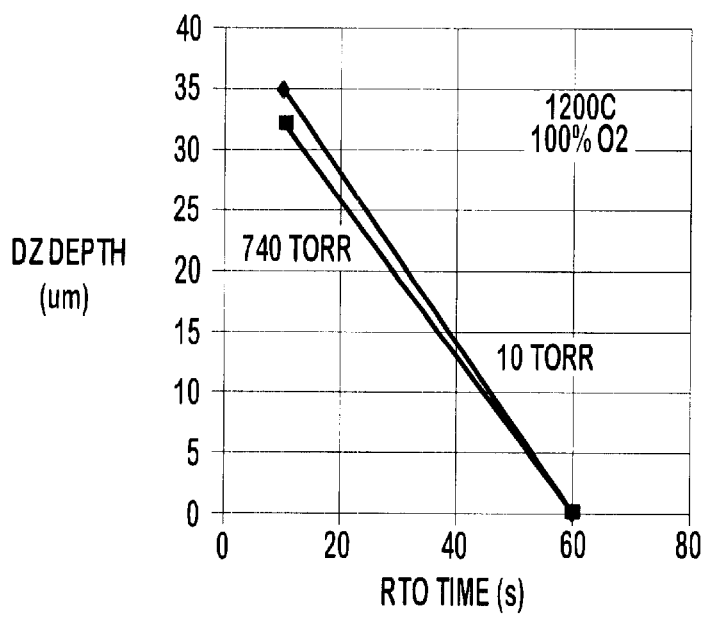
FIG. 10 is a graph of denuded zone depth versus pressure for 1200° C. RTO processes on pure oxygen for pressures of 10 T and 740 T.
Figure 11:
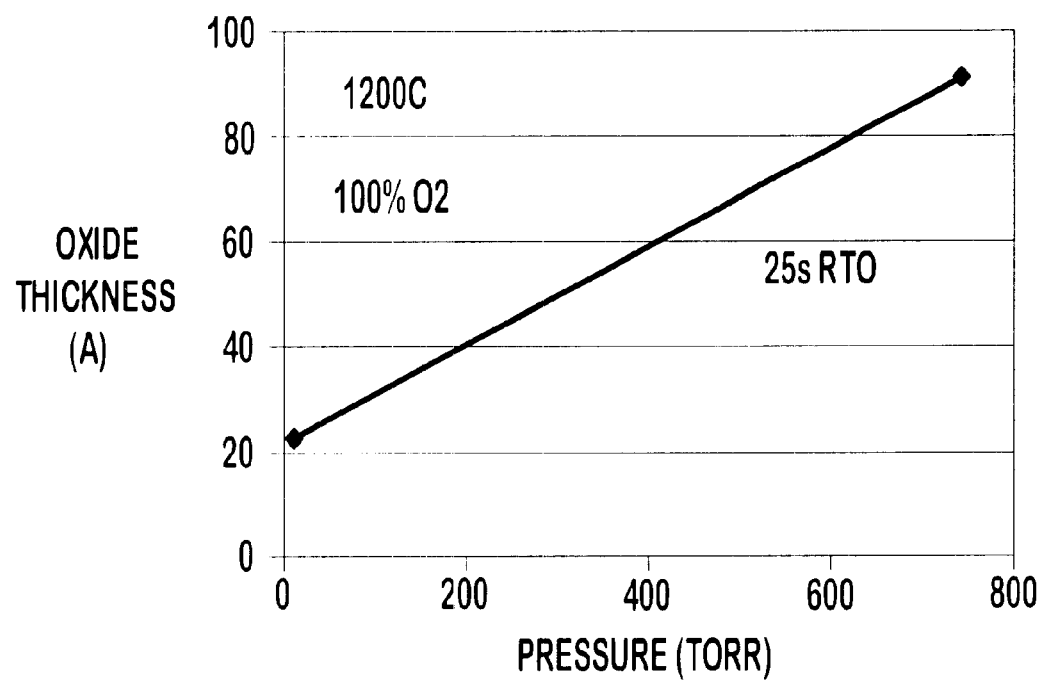
FIG. 11 is a graph of oxide thickness versus pressure at 1,200° C. using 100% oxygen.

Reference is now made to FIG. 10, which is a graph of the denuded zone depth versus pressure in 100% $O_2$ at 1200° C. As can be seen from FIG. 10, the depth of the denuded zone only weakly depends on the total pressure in 100% $O_2$ ambient. In this example, the target oxide thickness is 80 A, and the DZ depth is 20 $\mu$m. FIG. 10 also shows that, the DZ of 20 $\mu$m corresponds to a RTO time of approximately 25 seconds. A target oxide thickness is set by choosing the total pressure. As can be seen from FIG. 6, a pressure of 200 T is required.

FIG. 6 is a graph of oxide thickness as a function of pressure at 1200° C. for 25 second RTO processes in 100% $O_2$. The BMD density in this case is approximately 2.5 e 9 $cm^{-3}$, as can be seen in FIG. 9.

In the context of the invention, the process is operable to adjust the oxide thickness by diluting oxygen and argon or nitrogen at atmospheric pressure; however, in the preferred embodiment, 100% $O_2$ or other oxidizing species agents such as $N_2O$ or NO are used in order to avoid pitting of the silicon surface.

It is to be understood that various changes may be made in the process of the invention without departing from the scope of the invention, and it is to be understood that the examples given are by way of illustration and not by limitation.

What is claimed is:

1. A combined preanneal/oxidation single rapid thermal process (RTP) to simultaneously obtain a preselected thermal oxide thickness and a corresponding preselected denuded zone depth and bulk micro defect density (BMD) on a silicon wafer, comprising:

exposing the wafer to a controlled temperature and a controlled preannealing time in an oxidation ambient selected from 100% oxygen argon with about 5% oxygen, NO and $N_2O$ for about 10 seconds at ambient pressure to obtain a preselected target pad thermal oxide thickness about 4 nm to about 8 nm that corresponds to a preselected target denuded zone depth of about 10 $\mu$m and thereby eliminate the need to strip an oxide layer of uncontrollable thickness prior to formation of a pad nitride; said controlled temperature ranging from about 1,150° C. to about 1,200° C.

2. The process of claim 1 wherein said thermal oxide thickness is adjusted by varying said ambient pressure.

3. The process of claim 1 wherein said target thermal pad oxide thickness of about 4 nm.

4. The process of claim 1 wherein said target thermal pad oxide thickness is about 8 nm, and said BMD density is about 3 e 8 $cm^{-3}$.

5. The process of claim 1 wherein said BMD density is about 2.5 e 9 $cm^{-3}$ and said ambient pressure is about 200 T.

6. A combined reduced pressure, preanneal/oxidation single rapid thermal process (RTP) to simultaneously obtain a preselected thermal oxide thickness and a corresponding preselected denuded zone depth and bulk micro defect density (BMD) on a silicon wafer, comprising:

exposing the wafer to a controlled temperature and a controlled preannealing time in an oxidation ambient selected from 100% oxygen argon with about 5% oxygen, NO and N$_2$O for about 25 seconds at a reduced pressure of about 200 T to obtain a preselected target pad thermal oxide thickness of about 80 Å that corresponds to a preselected target denuded zone depth of about 20 μm and thereby eliminate the need to strip an oxide layer of uncontrollable thickness prior to formation of a pad nitride; said controlled temperature ranging from about 1,150° C. to about 1,200° C.

* * * * *